(12) United States Patent
Salama et al.

(10) Patent No.: US 8,618,593 B2
(45) Date of Patent: Dec. 31, 2013

(54) LOW TEMPERATURE DEPOSITION AND ULTRA FAST ANNEALING OF INTEGRATED CIRCUIT THIN FILM CAPACITOR

(75) Inventors: Islam A. Salama, Chandler, AZ (US); Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/214,773

(22) Filed: Aug. 22, 2011

(65) Prior Publication Data
US 2011/0304018 A1 Dec. 15, 2011

Related U.S. Application Data

(62) Division of application No. 11/277,606, filed on Mar. 27, 2006, now Pat. No. 8,003,479.

(51) Int. Cl.
*H01L 27/108* (2006.01)
*H01L 29/94* (2006.01)
*H01L 21/02* (2006.01)

(52) U.S. Cl.
USPC ............. 257/309; 257/532; 257/E23.114

(58) Field of Classification Search
USPC .......................................... 257/309
See application file for complete search history.

(56) References Cited

U.S. PATENT DOCUMENTS

| | | | |
|---|---|---|---|
| 5,384,266 A * | 1/1995 | Chapman | 438/516 |
| 6,130,124 A | 10/2000 | Lee | |
| 6,326,258 B1 | 12/2001 | Iizuka et al. | |
| 6,326,285 B1 | 12/2001 | Behfar et al. | |
| 6,326,316 B1 | 12/2001 | Kiyotoshi et al. | |
| 6,477,034 B1 | 11/2002 | Chakravorty et al. | |
| 6,812,130 B1 | 11/2004 | Brase | |
| 6,829,133 B2 | 12/2004 | Wermer et al. | |
| 6,852,416 B2 | 2/2005 | Zhang et al. | |
| 6,955,925 B1 | 10/2005 | Donohue et al. | |
| 7,025,607 B1 | 4/2006 | Das et al. | |
| 7,572,709 B2 | 8/2009 | Seh et al. | |
| 8,003,479 B2 | 8/2011 | Salama et al. | |
| 2002/0134581 A1 | 9/2002 | Figueroa et al. | |
| 2003/0052357 A1 * | 3/2003 | Hayashi et al. | 257/310 |
| 2003/0205406 A1 | 11/2003 | Wermer et al. | |

(Continued)

FOREIGN PATENT DOCUMENTS

| | | |
|---|---|---|
| JP | 2000306767 | 11/2000 |
| JP | 2009219587 | 10/2009 |

(Continued)

OTHER PUBLICATIONS

"U.S. Appl. No. 11/277,606 Final Office Action mailed Jul. 22, 2010", 13 Pgs.

(Continued)

*Primary Examiner* — Daniel Luke
(74) *Attorney, Agent, or Firm* — Schwegman Lundberg & Woessner, P.A.

(57) ABSTRACT

Some embodiments of the invention include thin film capacitors formed on a package substrate of an integrated circuit package. At least one of the film capacitors includes a first electrode layer, a second electrode layer, and a dielectric layer between the first and second electrode layers. Each of the first and second electrode layers and the dielectric layer is formed individually and directly on the package substrate. Other embodiments are described and claimed.

19 Claims, 8 Drawing Sheets

(56) References Cited

U.S. PATENT DOCUMENTS

| | | | |
|---|---|---|---|
| 2004/0018693 A1 | 1/2004 | Shioga et al. | |
| 2004/0080021 A1* | 4/2004 | Casper et al. | 257/528 |
| 2004/0147139 A1 | 7/2004 | Jiang | |
| 2005/0007723 A1 | 1/2005 | Mosley | |
| 2005/0017333 A1* | 1/2005 | Bohr | 257/678 |
| 2005/0017345 A1* | 1/2005 | Sathe | 257/700 |
| 2005/0094452 A1 | 5/2005 | Lee et al. | |
| 2005/0170599 A1* | 8/2005 | Joo | 438/396 |
| 2005/0185486 A9 | 8/2005 | Kyun et al. | |
| 2006/0000542 A1 | 1/2006 | Palanduz et al. | |
| 2006/0007723 A1 | 1/2006 | Aoki et al. | |
| 2006/0091495 A1 | 5/2006 | Pallanduz et al. | |
| 2006/0097246 A1 | 5/2006 | Palanduz et al. | |
| 2006/0099803 A1 | 5/2006 | Min | |
| 2006/0220167 A1 | 10/2006 | Min et al. | |
| 2006/0228855 A1 | 10/2006 | Min et al. | |
| 2006/0281278 A1 | 12/2006 | Min | |
| 2006/0289976 A1 | 12/2006 | Min | |
| 2007/0222030 A1 | 9/2007 | Salama et al. | |
| 2008/0003765 A1 | 1/2008 | Seh et al. | |
| 2008/0145622 A1 | 6/2008 | Roy et al. | |
| 2009/0273057 A1 | 11/2009 | Seh et al. | |

FOREIGN PATENT DOCUMENTS

| | | |
|---|---|---|
| KR | 1992-9171 | 10/1992 |
| KR | 10-1077310 | 10/2011 |
| WO | WO-2007117873 A1 | 10/2007 |

OTHER PUBLICATIONS

"U.S. Appl. No. 11/277,606, Non Final Office Action mailed Feb. 3, 2009", 14 pgs.
"U.S. Appl. No. 11/277,606, Final Office Action mailed Oct. 9, 2009", 12 pgs.
"U.S. Appl. No. 11/277,606, Non-Final Office Action mailed Feb. 3, 2010", 12 pgs.
"U.S. Appl. No. 11/277,606, Notice of Allowance mailed Apr. 18, 2011", 11 pgs.
"U.S. Appl. No. 11/277,606, Response filed Jan. 11, 2010 to Final Office Action mailed Oct. 9, 2009", 9 pgs.
"U.S. Appl. No. 11/277,606, Response filed Mar. 28, 2008 to Restriction Requirement mailed Feb. 28, 2008", 6 pgs.
"U.S. Appl. No. 11/277,606, Response filed Jul. 3, 2009 to Non Final Office Action mailed Feb. 3, 2009", 11 pgs.
"U.S. Appl. No. 11/277,606, Response filed Oct. 14, 2010 to Final Office Action mailed Jul. 22, 2010", 9 pgs.
"U.S. Appl. No. 11/277,606, Response filed Apr. 30, 2010 to Non Final Office Action mailed Feb. 3, 2010", 10 pgs.
"U.S. Appl. No. 11/277,606, Restriction Requirement mailed Feb. 28, 2008", 6 pgs.
"U.S. Appl. No. 11/427,532, Non-Final Office Action mailed Apr. 7, 2008", 13 pgs.
"U.S. Appl. No. 11/427,532, Non-Final Office Action mailed Oct. 16, 2008", 11 pgs.
"U.S. Appl. No. 11/427,532, Notice of Allowance mailed Feb. 26, 2009", 7 pgs.
"U.S. Appl. No. 11/427,532, Response filed Dec. 28, 2007 to Restriction Requirement mailed Nov. 30, 2007", 4 pgs.
"U.S. Appl. No. 11/427,532, Response filed Jul. 7, 2008 to Non-Final Office Action mailed Apr. 7, 2008", 8 pgs.
"U.S. Appl. No. 11/427,532, Restriction Requirement mailed Nov. 30, 2007", 6 pgs.
"U.S. Appl. No. 11/610,601 Non-Final Office Action mailed Aug. 24, 2009", 15 Pgs.
"U.S. Appl. No. 11/610,601, Final Office Action mailed Jan. 6, 2010", 17 pgs.
"U.S. Appl. No. 11/610,601, Response filed Sep. 24, 2009 to Non Final Office Action mailed Aug. 24, 2009", 10 pgs.
"Chinese Application Serial No. 200780010702.6, Office Action mailed Jun. 8, 2010", with English translation, 15 pgs.
"International Application No. PCT/2007/064275 PCT Search Report", (Sep. 4, 2007), 5 pgs.
"International Application No. PCT/2007/064275 PCT Written Opinion", (Sep. 4, 2007), 6 pgs.
"Japanese Application Serial No. 2008-551578, Office Action mailed Apr. 14, 2011", and English translation, 7 pgs.
"Korean Application Serial No. 2008-7023433, Office Action mailed Jan. 12, 2011", with English translation, 7 pgs.
"Korean Application Serial No. 2008-7023433, Office Action mailed Aug. 4, 2010", with English translation, 7 pgs.
"Korean Application Serial No. 2008-7023433, Response filed Mar. 11, 2011 to Non Final Office Action mailed Jan. 12, 2011", and English translation of claims, 6 pgs.
"Taiwanese Application Serial No. 96109527, Office Action mailed Nov. 11, 2010", 15 pgs.
"Taiwanese Application Serial No. 96109527, Office Action Response filed Apr. 27, 2011", and English translation, 7 pgs.
Achar, B. N., et al., "Phthalocyanine Polymers. II Synthesis and Characterization of Some Metal Phthalocyanine Sheet Oligomers.", J. Polym. Sci. Polym. Chem., 20, (1982), 1785-1790.
Min, Y., et al., "Integrated Thin Film Capacitors With Adhesion Holes for the Improvement of Adhesion Strength", U.S. Appl. No. 11/304,649, filed Dec. 14, 2005.
Min, Y., "Method of Providing a Via Opening in a Dielectric Film of a Thin Film of a Thin Film Capacitor", U.S. Appl. No. 11/297,854 filed Dec. 8, 2005.
Zhang, Q. M., et al., "An All-organic Composite Actuator Material With a High Dielectric Constant", Nature, 419(6904), (Sep. 19, 2002), 284-287.
"U.S. Appl. No. 11/277,606, Examiner Interview Summary mailed Oct. 21, 2010", 3 pgs.
"U.S. Appl. No. 11/277,606, Non Final Office Action mailed Apr. 22, 2008", 11 pgs.
"U.S. Appl. No. 11/610,601, Response filed Jun. 8, 2009 to Restriction Requirement mailed May 27, 2009", 3 pgs.
"U.S. Appl. No. 11/610,601, Restriction Requirement mailed May 27, 2009", 4 pgs.
"Chinese Application Serial No. 200780010702.6, Decision on Rejection mailed Dec. 28, 2011", 13 pgs.
"Chinese Application Serial No. 200780010702.6, Response filed Apr. 12, 2012 to Office Action mailed Dec. 28, 2011", 13 pgs.
"Japanese Application Serial No. 2008-551578, Office Action mailed Feb. 21, 2012", 4 pgs.
"Japanese Application Serial No. 2008-551578, Office Action Response filed Sep. 20, 2011", 14 pgs.
"Taiwanese Application Serial No. 96109527, Office Action mailed Sep. 26, 2011", 15 pgs.

* cited by examiner

LOW TEMPERATURE DEPOSITION AND ULTRA FAST ANNEALING OF INTEGRATED CIRCUIT THIN FILM CAPACITOR

PRIORITY APPLICATION

This application is a Divisional of U.S. application Ser. No. 11/277,606, filed Mar. 27, 2006, now U.S. Pat. No. 8,003,479 which is incorporated herein by reference in its entirety.

FIELD

Embodiments of the present invention relate to integrated circuit packaging, and particularly to capacitors in integrated circuit packages.

BACKGROUND

Computers and electronic devices usually include an integrated circuit package. The package may often have a die mounted on a base or substrate of the package. The die may include an integrated circuit for performing an electrical function. The package may also have one or more capacitors formed on the substrate. The capacitors may be used in various ways based on the function of the integrated circuit. The capacitor may be formed from multiple layers of thin films of conductive material and dielectric material.

In some conventional techniques, the capacitor is preformed in a separate process then the entire pre-formed capacitor is mounted or laminated onto the substrate of the package in another separate process. The process of mounting the pre-formed capacitor onto a substrate in the conventional techniques is often called capacitor-to-substrate lamination process.

Forming the capacitor in a package using the conventional techniques with the lamination process may require both a careful handling of the thin films of the pre-formed capacitor before the lamination and a high degree of alignment accuracy during the lamination. Some of these conventional techniques may also be expensive and time consuming.

DESCRIPTION OF EMBODIMENTS

Figure 1:
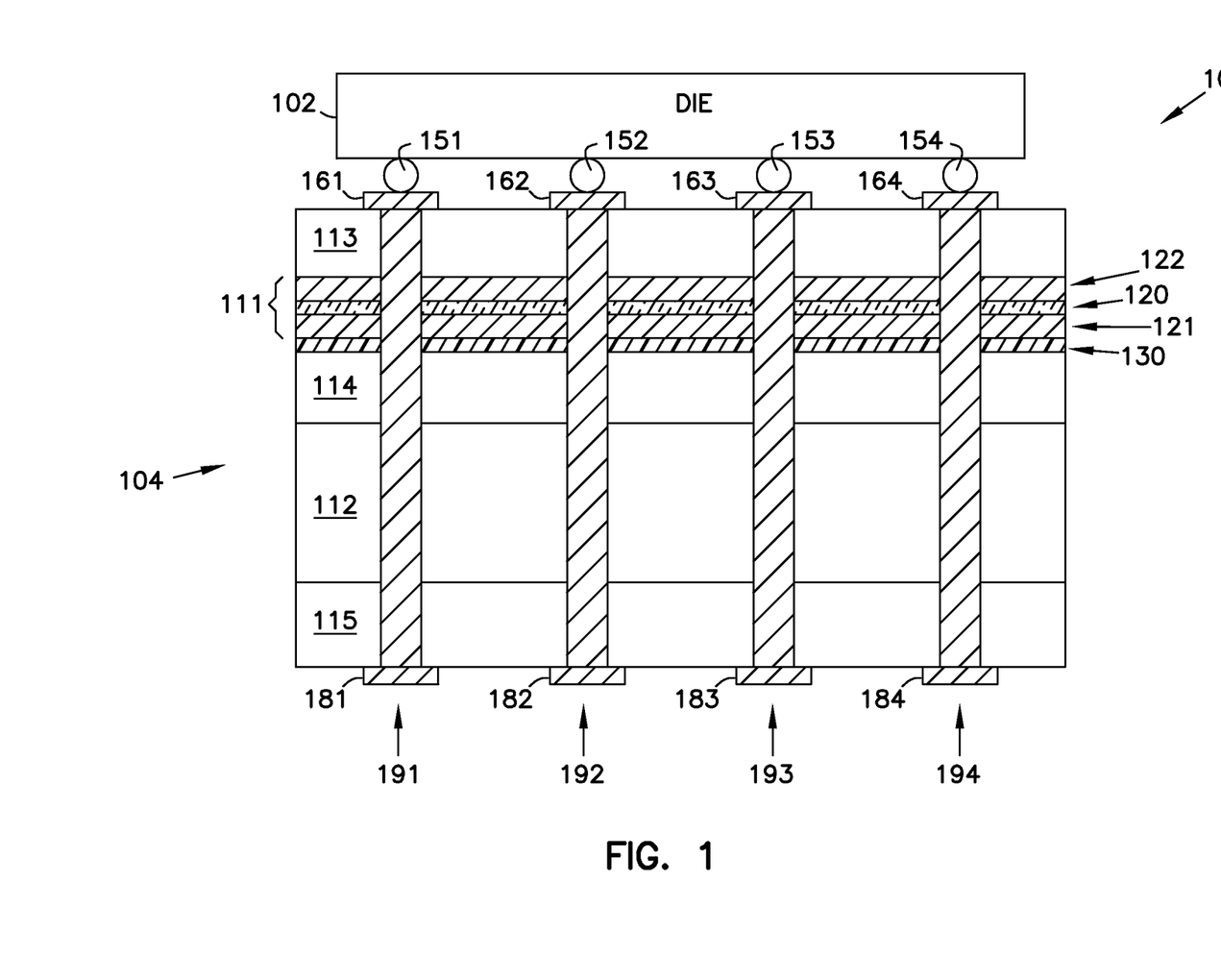
FIG. 1 shows an apparatus according to an embodiment of the invention.

FIG. 1 shows a package 100 according to an embodiment of the invention. Package 100 may be an integrated circuit package. Package 100 includes a die 102 attached to a substrate 104. Substrate 104 may be called a package substrate. Die 102 may include one or more integrated circuits. In some embodiments, die 102 may include an integrated circuit to perform a function of a processor, a communication device, a memory device, or some combination thereof. Die 102 may include integrated circuits to perform other functions. In some embodiments, package 100 resides in a system or in a device such a computer or a communication device (e.g., a cellular phone).

Package 100 includes conductive contacts or pads 161, 162, 163, and 164 on one side of substrate 104 and conductive contacts or pads 181, 182, 183, and 184 on another side of substrate 104. Package 100 also includes conductive paths or interconnects 191, 192, 193, and 194 extending between contacts 161 through 164 and contacts 181 through 184. Die 102 couples to substrate 104 through conductive elements, for example, through solder balls 151, 152, 153, and 154.

In a system or a device, for example, a computer or a wireless communication device, conductive contacts 181 through 184 may be coupled to a platform such as a circuit board (not shown) to allow die 102 to exchange information or data with other components through conductive paths 191, 192, 193, and 194. A group of the conductive paths 191 through 194 may be coupled to power terminals as positive and ground terminals of a power source. Another group of the conductive paths 191 through 194 may be coupled to other components of the system or device to transfer data. FIG. 1 shows package 100 with four conductive paths, 191 through 194, for example purposes. The number of conductive paths of package 100 may vary. For example, package 100 may include numerous conductive paths forming a high-density interconnect arrangement.

Substrate 104 includes a core layer 112, and buildup layers 113, 114, and 115. Core layer 112 may include organic material. Buildup layers 113, 114, and 115 may include organic material. In some embodiments, one or more of the buildup layers 113, 114, and 115 may include a polymer material or an Ajinomoto buildup film (ABF).

Substrate 104 further includes a barrier layer 130. Barrier layer 130 may be a non-conductive layer. Barrier layer 130 may include an inorganic material. In some embodiments, barrier layer 130 may include a partially or completely oxidized material. In other embodiments, barrier layer 130 may include a compound of at least one non-conductive material and oxygen or nitrogen, or both oxygen and nitrogen. In some other embodiments, barrier layer 130 may include a compound of at least one semiconductor material and oxygen or nitrogen, or both oxygen and nitrogen. The semiconductor material may include silicon. For example, barrier layer 130 may include silicon dioxide, silicon nitride, or silicon oxynitride. In some embodiments, barrier layer 130 has a thickness of about one micrometer.

A number of thin film capacitors 111 are formed on barrier layer 130 and are embedded in substrate 104. As shown in FIG. 1, thin film capacitors 111 are embedded in substrate 104 between buildup layer 113 and other layers of substrate 104. Thin film capacitors 111 are referred to as integrated thin film capacitors. For clarity, FIG. 1 shows a high-level diagram of thin film capacitors 111. Detail formation of some embodiments of thin film capacitors 111 are shown in FIG. 2 through FIG. 9. In the description herein, thin film capacitors (TFC) 111 are collectively called TFC 111. The term TFC, such as TFC 111, refers to either a single integrated thin film capacitor or a group of multiple integrated thin film capacitors. In FIG. 1, TFC 111 may be used in different ways. For example, one or more of the TFC 111 may be used as filtering capacitors or coupling capacitors in a signal filtering or power distribution circuitry.

TFC 111 includes conductive layers or electrode layers 121 and 122, and a dielectric layer 120. Conductive layers 121 and 122 may include copper, nickel, or other conductive materials. In some embodiments, at least one of the conductive layers 121 and 122 may be a foil or thin film with a thickness of about 10 micrometers. In other embodiments, at least one of the conductive layers 121 and 122 may be a thin film with a thickness of about 15 micrometers. In some other embodiments, at least one of the conductive layers 121 and 122 may be a thin film with a thickness between about 10 micrometers and about 15 micrometers.

Dielectric layer 120 may include a high dielectric constant (high k) material. In some embodiments, dielectric layer 120 may have a dielectric constant of about 400. In other embodiments, dielectric layer 120 may have a dielectric constant of about 6000. In some other embodiments, dielectric layer 120 may have a dielectric constant between about 400 and about 6000. Dielectric layer 120 may include a ceramic material. Some examples of materials of dielectric layer 120 include barium titanate $BaTiO_3$, strontium titanate $SrTiO_3$, and barium strontium titanate $BaSrTiO_3$. In some embodiments, dielectric layer 120 has a thickness of about one micrometer.

In FIG. 1, each of the components of TFC 111, such as conductive layers 121 and 122, and dielectric layer 120, is formed directly on and embedded in substrate 104 without a lamination process such that none of the portions or components of TFC 111 is pre-formed and then laminated onto substrate 104.

In some embodiments, TFC 111 may be formed in an in-situ process such that each of the components of TFC 111 is formed individually and directly on one or more layers of substrate 104. For example, in the in-situ process, conductive layer 121 may be formed directly over barrier layer 130, core layer 112, and buildup layers 114 and 115. In the in-situ process, dielectric layer 120 may be formed directly on conductive layer 121 and then annealed while dielectric layer 120 is over conductive layer 121, barrier layer 130, core layer 112, and buildup layers 114 and 115. In the in-situ process, conductive layer 122 may be formed directly on dielectric layer 120 while dielectric layer 120 is over conductive layer 121, barrier layer 130, core layer 112, and buildup layers 114 and 115. The in-situ process for forming TFC 111 directly on substrate 104 may simply fabrication process and reduce fabrication time.

In some embodiments, one or more of layers of package 100 may be omitted. For example, buildup layer 114 may be omitted such that barrier layer 130 may be formed directly on core layer 112. In other embodiments, barrier layer 130 may be omitted such that TFC 111 may be formed directly on buildup layer 114. In some other embodiments, both barrier layer 130 and buildup layer 114 may be omitted such that TFC 111 may be formed directly on core layer 112.

FIG. 1 shows TFC 111 being formed above core layer 112. In some embodiments, TFC 111 may be formed below core layer 112. For example, TFC 111 may be formed between core layer 112 and buildup layer 115. In some embodiments, besides TFC 111, one or more additional TFC may be formed and embedded in substrate 104.

FIG. 2 through FIG. 9 show a thin film capacitor (TFC) during various processes according to an embodiment of the invention.

Figure 2:
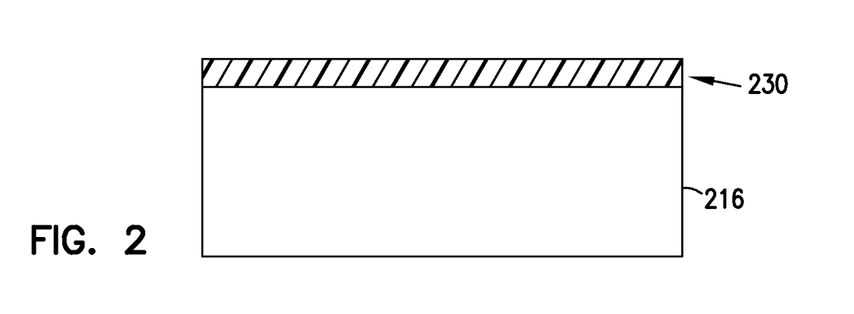
FIG. 2 through FIG. 9 show an integrated thin film capacitor during various processes according to an embodiment of the invention.

FIG. 2 shows a substrate portion 216 and a barrier layer 230 formed on a substrate portion 216. Substrate portion 216 may be a portion of a package substrate such as substrate 104 of package 100 of FIG. 1. Substrate portion 216 may include a buildup layer, or a core layer, or a combination of a core layer and at least one buildup layer of a package substrate. For example, using FIG. 1 as a reference, substrate portion 216 of FIG. 2 may include a buildup layer such as buildup layer 114, or a core layer such as core layer 112, or a combination of layers such as core layer 112 and at least one of the buildup layers 114 and 115.

In FIG. 2, substrate portion 216 may include an organic material. In some embodiments, substrate portion 216 may include at least one polymer layer. In some embodiments, substrate portion 216 may include an Ajinomoto buildup film (ABF). In FIG. 2, barrier layer 230 may be deposited directly on substrate portion 216. For example, barrier layer 230 may be deposited by physical vapor deposition (PVD). Barrier layer 230 may be formed by other methods. Barrier layer 230 may include an oxide, nitride, or other materials. For example, barrier layer 230 may include silicon oxide, silicon nitride, or silicon oxynitride. In some embodiments, barrier layer 230 has a thickness of about one micrometer.

Figure 3:
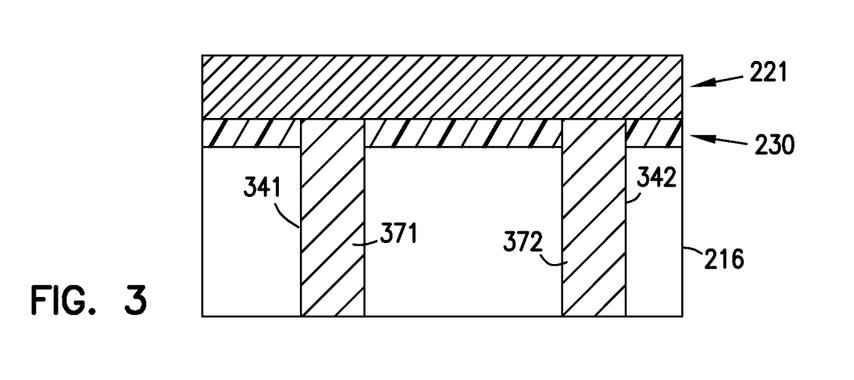

FIG. 3 shows a conductive layer 221. FIG. 3 shows conductive segments 371 and 372 extending through barrier layer 230 and substrate portion 216. Conductive segments 371 and 372 may be formed before or after conductive layer 221 is formed. In some embodiments, conductive segments 371 and 372 are formed before conductive layer 221 is formed by forming vias 341 and 342 through barrier layer 230 and substrate portion 216 and then filling vias 341 and 342 with a conductive material. In other embodiments, conductive segments 371 and 372 are formed after conductive layer 221 is formed by forming vias 341 and 342 through conductive layer 221, barrier layer 230, and substrate portion 216 and then filling vias 341 and 342 with a conductive material. The material for conductive segments 371 and 372 may be different from the conductive material for conductive layer 221. Vias 341 and 342 may be formed by drilling, or by other methods. In some embodiments, a laser may be used to form vias 341 and 342.

In some embodiments, conductive layer 221 may be formed by deposition of a conductive material on barrier layer 230. Conductive layer 221 may include a single conductive material or a compound of multiple materials. In some embodiments, conductive layer 221 may include copper or nickel. In other embodiments, conductive layer 221 may include other conductive materials. In some embodiments, conductive layer 221 has a thickness of about 15 micrometers.

Figure 4:
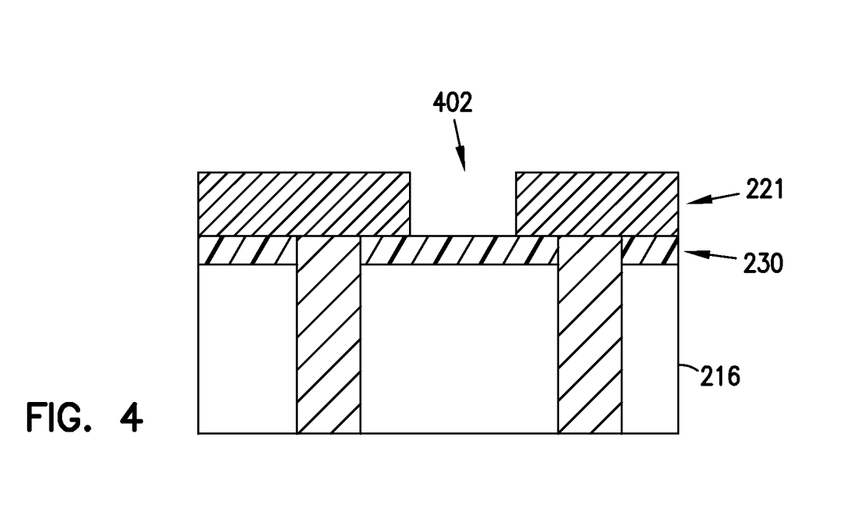

FIG. 4 shows conductive layer 221 with an opening 402. As shown in FIG. 4, opening 402 exposes a portion of barrier layer 230. Opening 402 may be formed by patterning conductive layer 221 after conductive layer 221 is formed on barrier layer 230 and substrate portion 216. In some embodiments, etching, laser drilling, or other methods may be used to pattern conductive layer 221 to form opening 402.

Figure 5:
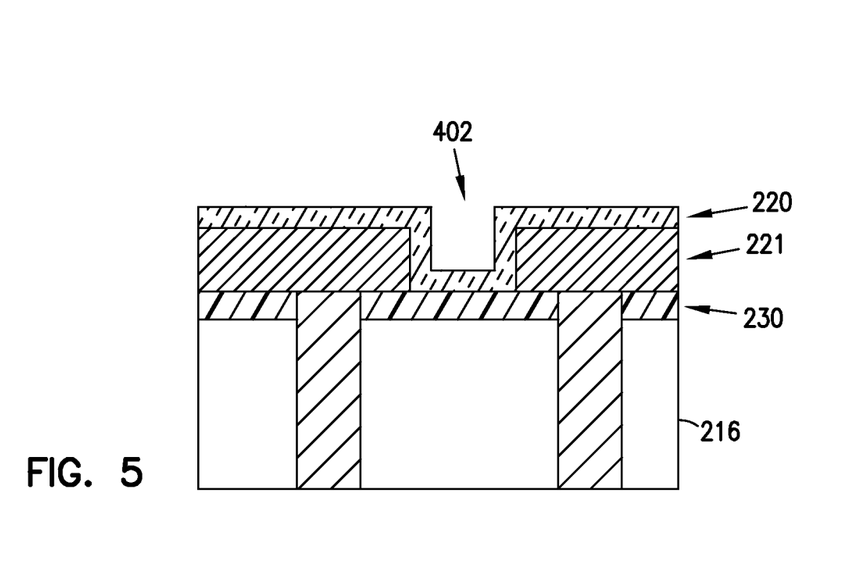

FIG. 5 shows a dielectric layer 220 formed on conductive layer 221. As shown in FIG. 5, a portion of portion of dielectric layer 220 directly contacts barrier layer 230 at opening 402. Dielectric layer 220 may be formed by depositing a dielectric material directly on conductive layer 221. Some examples of methods for forming dielectric layer 220 include sputtering, ion plating, plasma enhanced chemical vapor deposition (PECVD), plasma spray, thermal spray, printing, and aerosol. Other methods may be used. In some embodiments, the dielectric material for dielectric layer 220 may include a ceramic material. Some examples of materials for dielectric layer 220 include barium titanate $BaTiO_3$, strontium titanate $SrTiO_3$, and barium strontium titanate $BaSrTiO_3$. In some embodiments, dielectric layer 220 has a thickness of about one micrometer.

Dielectric layer 220 may be formed at a temperature such that thermal damage to layers underneath dielectric layer 220 may be avoided. In some embodiments, dielectric layer 220 may be formed at a temperature of about 200° C. In other embodiments, dielectric layer 220 may be formed at a temperature lower than 200° C. In some other embodiments, dielectric layer 220 may be formed at room temperature, for example, at about 25° C.

Forming dielectric layer 220 at a temperature of about 200° C. or lower, in some embodiments, may prevent thermal damage to the structure underneath dielectric layer 220, such as substrate portion 216. For example, substrate portion 216 may have a low melting point such that thermal damage may happen to substrate portion 216 when dielectric layer 220 is formed at a temperature higher than 200° C. Therefore, in some embodiments, forming dielectric layer 220 at a temperature at about 200° C. or lower may prevent thermal damage to layers underneath dielectric layer 220.

Figure 6:
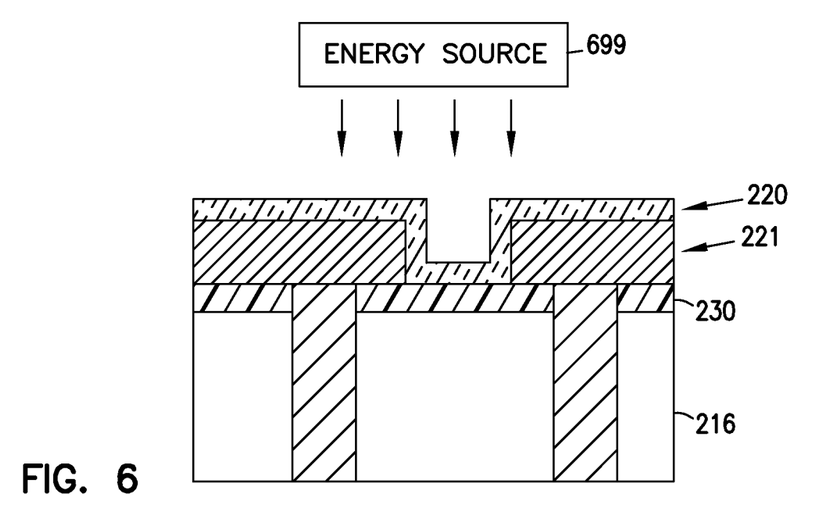

FIG. 6 shows dielectric layer 220 being annealed. An energy source 699 is used for annealing dielectric layer 220. In some embodiments, energy source 699 may include a laser source such as an excimer (exciplex) laser source. The laser source may include an ultraviolet (UV) or deep UV laser source.

In FIG. 6, annealing of dielectric layer 220 allows it to have a relatively high dielectric constant or high k. In some embodiments, dielectric layer 220 may have a dielectric constant of about 400. In other embodiments, dielectric layer 220 may have a dielectric constant of about 6000. In some other embodiments, dielectric layer 220 may have a dielectric constant between about 400 and about 6000. In some embodiments, dielectric layer 220 may be formed at room temperature (as described in FIG. 5) and annealed at a different temperature to enable dielectric layer 220 to have a dielectric constant between about 2000 and about 4000. In other embodiments, dielectric layer 220 may be formed at room temperature (as described in FIG. 5) and annealed at a temperature between about 600° C. and about 800° C. to make dielectric layer 220 to have a dielectric constant of about 3000. In some embodiments, dielectric layer 220 may be annealed by a rapid thermal annealing process.

In some embodiments, dielectric layer 220 may be annealed at a temperature sufficient to allow the dielectric constant of dielectric layer 220 to be between about 400 and about 6000 without inducing thermal damage to substrate portion 216. In some embodiments, dielectric layer 220 is annealed at a temperature of about 600° C. In other embodiments, dielectric layer 220 is annealed at a temperature of about 800° C. In some other embodiments, dielectric layer 220 is annealed at a temperature between about 600° C. and about 800° C.

In some embodiments, dielectric layer 220 is rapidly annealed with a localized heating such that energy or heat from energy source 699 is mostly applied to dielectric layer 220. Using localized heating to anneal dielectric layer 220 may prevent heat from dissipating to substrate portion 216, thereby preventing thermal damage to substrate portion 216.

In some embodiments, dielectric layer 220 may be rapidly annealed by laser. For example, a laser beam from energy source 699 may be used to scan across the surface of dielectric layer 220 during a laser annealing process. In some embodiments, the laser beam may scan across each individual portion of dielectric layer 220 for less than ten microseconds. In some embodiments, the laser beam may have a pulse duration of about ten nanoseconds. Annealing dielectric layer 220 with laser allows for shallow thermal diffusion length inside dielectric layer 220 and prevents thermal energy from dissipating to substrate portion 216. Thus, thermal damage to substrate portion 216 may be avoided.

Further, the structure of FIG. 6 may assist in dissipating or transferring heat that is generated during the anneal process to further prevent thermal damage to substrate portion 216. For example, heat may be transferred to conductive layer 221 and conductive segments 371 and 372 during the anneal process, thereby reducing the amount of generated heat that would affect substrate portion 216.

Moreover, barrier layer 230 may assist in preventing thermal damage to substrate portion 216 when dielectric layer 220 is annealed. For example, in some embodiments, substrate portion 216 may have a low melting point such that, in the absence of barrier layer 230, annealing dielectric layer 220 at certain temperatures may induce thermal damage to substrate portion 216. However, with the inclusion of barrier layer 230, according to an embodiment described herein, barrier layer 230 may function as a thermal barrier layer to prevent the thermal energy from energy source 699 from propagating through substrate portion 216 during the anneal process, thereby thermal damage to substrate portion 216 may further be avoided.

Figure 7:
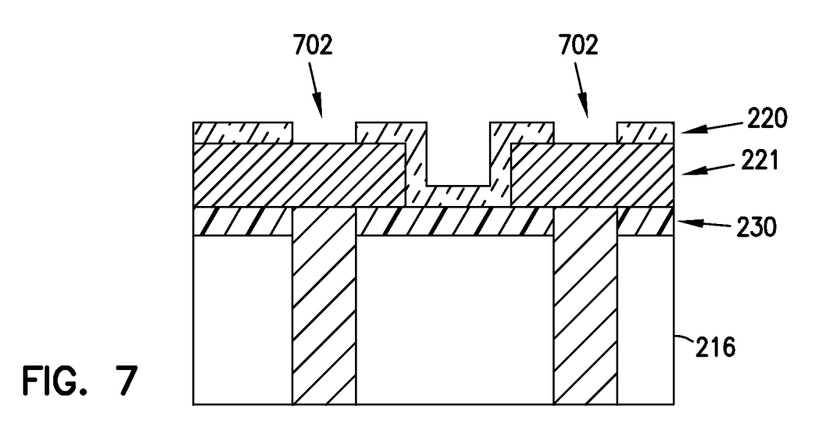

FIG. 7 shows dielectric layer 220 with openings 702. Openings 702 may be formed by patterning dielectric layer 220. In some embodiments, etching, laser drilling, or other methods may be used to pattern dielectric layer 220 to form openings 702. In FIG. 7, dielectric layer 220 is patterned after it is annealed. In some embodiments, dielectric layer 220 may be patterned before it is annealed. For example, dielectric layer 220 may be patterned in the process of described in FIG. 6, before dielectric layer 220 is annealed. Patterning dielectric layer 220 after dielectric layer 220 is annealed, as described in FIG. 7, may further protect substrate portion 216 when dielectric layer 220 is annealed.

Figure 8:
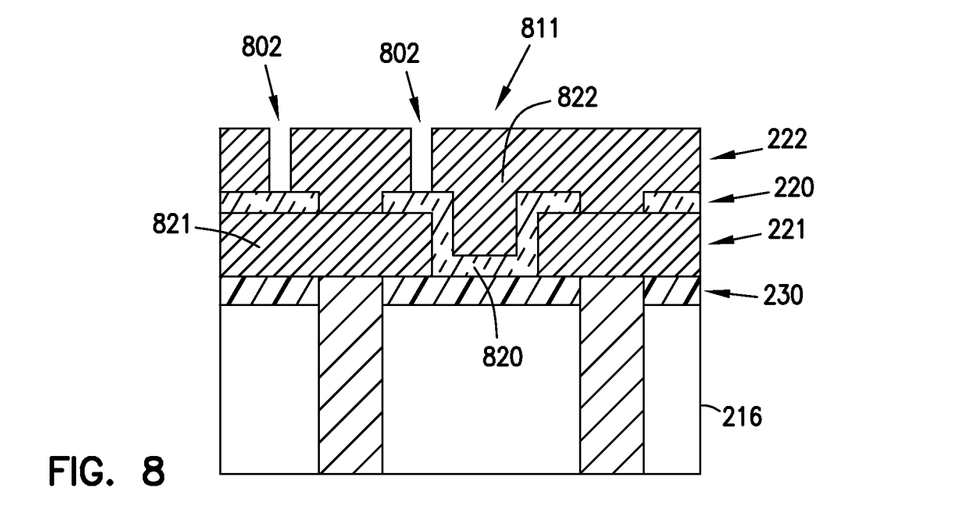

FIG. 8 shows a conductive layer 222 formed on dielectric layer 220. Conductive layer 222 is patterned to create openings or gaps 802. FIG. 8 also shows a structure of a TFC 811. The dielectric layer of TFC 811 includes portion 820 of the dielectric layer 220. The bottom electrode layer of TFC 811 includes portion 821 of conductive layer 221. The top electrode layer of TFC 811 includes portion 822 of conductive layer 222.

Figure 9:
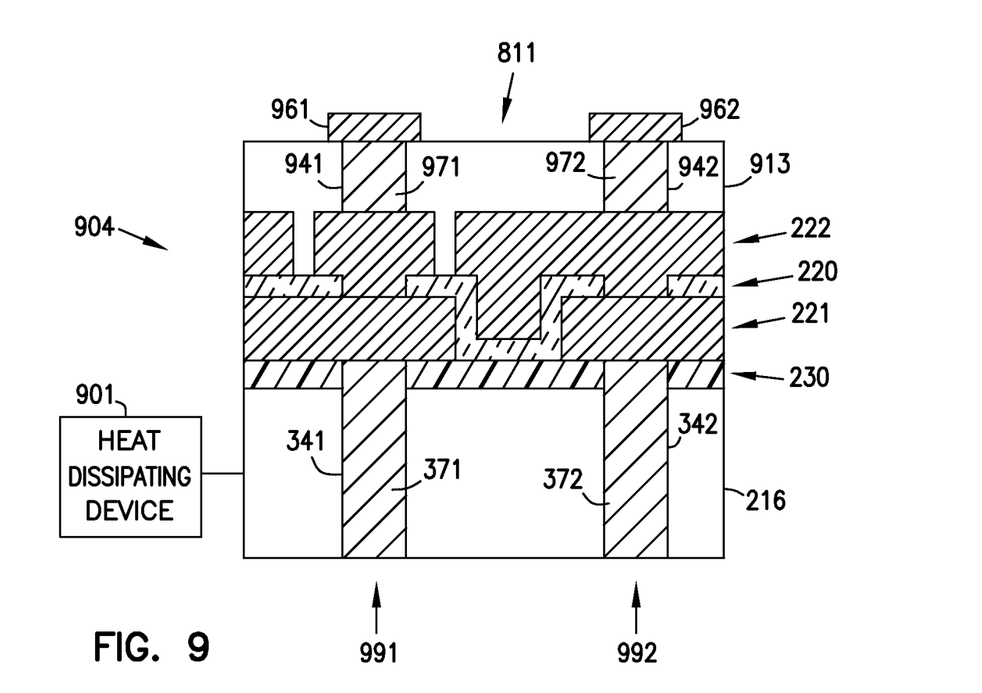

FIG. 9 shows a substrate portion 913, conductive segments 971 and 972, and conductive contacts or pads 961 and 962. Conductive segments 971 and 972 may be formed by forming and filling vias 941 and 942 with conductive material. In some embodiments, each of the conductive segments 371, 372, 971, 972, and conductive layers 221 and 222 may have a different material. As shown in FIG. 9, conductive segments 371 and 971 may be a part of a conductive path 991; conductive segments 372 and 972 may be a part of a conductive path 992. In some embodiments, conductive paths 991 and 992 of FIG. 9 may be a part of conductive paths such as conductive paths 191 and 192 of FIG. 1; conductive contacts 961 and 962 of FIG. 9 may be conductive contacts such as conductive contacts 161 and 162 of FIG. 1. The structure shown in FIG. 9 may be a part of a substrate 904. As described in FIG. 2 through FIG. 9, each of the first and second conductive layers 221 and 222 and dielectric layer 220 of TFC 811 is individually and directly formed on substrate 904. In some embodiments, substrate 904 may be a package substrate such as substrate 104 of package 100 of FIG. 1.

In some embodiments, a heat dissipating device 901 may be coupled or attached to substrate 904 to transfer or dissipate heat from substrate 904 when one or more of the components of substrate 904 or TFC 811 are formed. For example, heat dissipating device 901 may be used to dissipate heat that is generated when at least one of the first conductive layer 221, dielectric layer 220, and second conductive layer 222 is formed. Using a heat dissipating device such as heat dissipating device 901 may further reduce the affect of the generated heat to substrate portion 216 when dielectric layer 220 is annealed, thereby thermal damage to substrate portion 216 may further be avoided. In some embodiments, heat dissipating device 901 may include a heat sink.

In FIG. 2 through FIG. 9, the components of substrate 904 and TFC 811 are formed according to an example order. In some embodiments, the components of substrate 904 and TFC 811 may be formed in an order different from the order described herein.

In FIG. 2 through FIG. 9, barrier layer 230 is formed on substrate portion 216 before other layers are subsequently formed. As described in FIG. 2 through FIG. 9, barrier layer 230 is formed to prevent thermal damage to substrate portion 216 when the other layers above substrate portion 216 are formed. However, in some embodiments, barrier layer 230 may be omitted when the other layers above substrate portion 216 may be formed without inducing thermal damage to substrate portion 216. For example, barrier layer 230 may be omitted when conductive layer 221, dielectric layer 220, and conductive layer 222 may be formed without inducing thermal damage to substrate portion 216.

FIG. 2 through FIG. 9 show an example of forming a TFC such as TFC 811. Multiple thin film capacitors such as a multiple of TFC 811 of FIG. 9 may be formed in a process similar to that described in FIG. 2 through FIG. 9.

As described above in FIG. 2 through FIG. 9, the entire TFC 811 is formed and embedded in substrate 904 (FIG. 9) by separately or individually forming each component of TFC 811 directly on substrate 904. Thus, according to embodiments of the invention, a TFC such as TFC 811 is formed directly on and embedded in substrate 904 without a lamination process such that none of the portions or components of the TFC 811 is pre-formed and then laminated onto substrate 904.

Forming a TFC in a package such as forming TFC 111 or TFC 811 according to the embodiments of the invention may remove the requirement for the careful handling of the pre-formed capacitor, eliminate the requirement for an accurate alignment of the lamination process, and may reduce cost and fabrication time. Further, forming the capacitor in a package such as forming TFC 111 or TFC 811 according to the embodiments of the invention may allow for an easy formation of the vias. For example, the vias may be formed subsequently on the different layers as each layer is being formed.

Moreover, forming the capacitor in a package such as forming TFC 111 or TFC 811 according to the embodiments of the invention may allow for an in-situ process of forming the TFC on the substrate because the TFC does not have to be pre-formed in a separate process. The in-situ process of forming the TFC directly on the substrate may simply fabrication process and reduce fabrication time.

Figure 10:
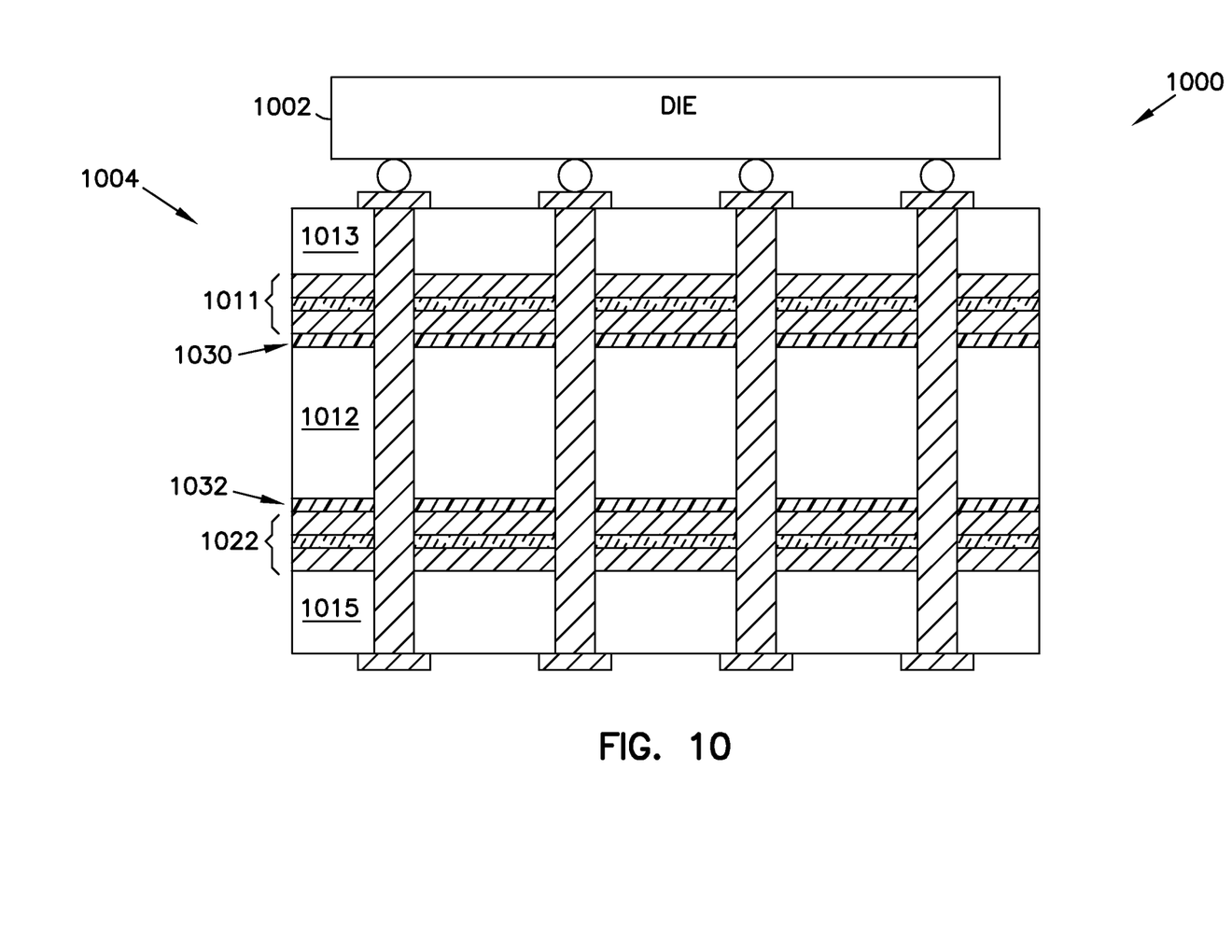
FIG. 10 shows a package having integrated thin film capacitors formed on both sides of a substrate portion of a substrate according to an embodiment of the invention.

FIG. 10 shows a package having an integrated TFC formed on both sides of a substrate portion of a substrate according to an embodiment of the invention. Package 1000 includes a die 1002 attached to a substrate 1004. Substrate 1004 includes substrate portions 1012, 1013, and 1015, a TFC 1011 and a barrier layer 1030 formed on one side of substrate portion 1012, and a TFC 1022 and a barrier layer 1032 formed on another side of substrate portion 1012. Each of the substrate portions 1012, 1013, and 1015 may include one or more organic layers. Each of the TFC 1011 and TFC 1022 may represent either a single integrated thin film capacitor or a group of multiple integrated thin film capacitors. As shown in FIG. 10, both TFC 1011 and TFC 1022 are embedded in substrate 1004. In some embodiments, TFC 1011, TFC 1022, and barrier layers 1030 and 1032 may be formed in a process at least similar to the process described in FIG. 2 through FIG. 9.

Figure 11:
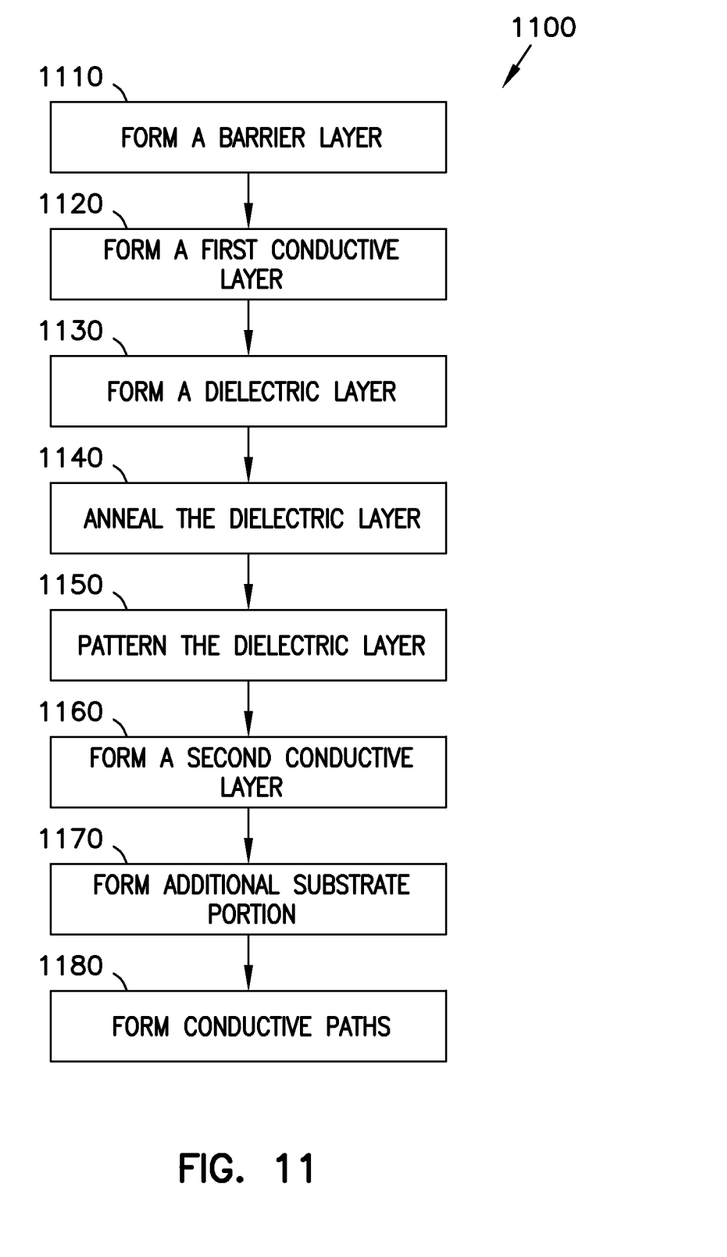
FIG. 11 is a flowchart showing a method according to an embodiment of the invention.

FIG. 11 is a flowchart of a method according to an embodiment of the invention. Method 1100 forms an integrated TFC directly on a substrate without pre-forming an entire TFC then laminating the entire pre-formed TFC onto the substrate. Method 1100 forms each component of the TFC individually and directly on the substrate in an in-situ process. In some embodiments, method 1100 may be used to form TFC 111 of FIG. 1, TFC 811 of FIG. 9, and TFC 1011 and TFC 1022 of FIG. 10.

In FIG. 11, activity 1110 of method 1100 forms a barrier layer on a substrate portion of a substrate of a package. The substrate portion may include at least one organic layer. The barrier layer may include an inorganic layer. In some embodiments, the barrier layer is formed for preventing heat from transferring to the substrate when one or more other layers are subsequently formed on the substrate. In some embodiments, activity 1110 may be used to form barrier layer 130 (FIG. 1) or barrier layer 230 (FIG. 2).

Activity 1120 of FIG. 11 forms a first conductive layer on the barrier layer. The first conductive layer may be patterned to form an opening to expose a portion of the barrier layer. The first conductive layer may include copper, nickel, or other conductive materials. In some embodiments, activity 1120 may be used to form conductive layer 221 as described in FIG. 3.

Activity 1130 of method 1100 forms a dielectric layer on the first conductive layer. The dielectric layer may be formed by depositing a dielectric material directly on the first conductive layer. The dielectric material may include a ceramic material. In some embodiments, the dielectric material may be deposited at a temperature of about 200° C. or lower. At least a portion of the dielectric layer may directly contact the barrier layer through the opening of the first conductive layer. In some embodiments, activity 1130 may be used to form dielectric layer 220 as described in FIG. 5.

Activity 1140 of method 1100 anneals the dielectric layer. A laser may be used to rapidly anneal the dielectric layer. In some embodiments, excimer laser annealing is used to locally anneal the dielectric layer to avoid thermal damage to the substrate portion underneath the dielectric layer. In some embodiments, the dielectric layer may be annealed at a temperature between about 600° C. and about 800° C. The dielectric layer may have a dielectric constant between about 400 and about 6000. In some embodiments, a heat dissipating device may be attached to the substrate to transfer or dissipate heat that is generated when the dielectric layer is annealed to further prevent thermal damage to the substrate. In some embodiments, activity 1140 may be used to anneal dielectric layer 220 as described in FIG. 6.

Activity 1150 of method 1100 patterns the dielectric layer. The dielectric layer may be patterned before or after the dielectric layer is annealed. In some embodiments, activity 1150 may be used to pattern dielectric layer 220 as described in FIG. 7.

Activity 1160 of method 1100 forms a second conductive layer on the dielectric layer. The second conductive layer may include copper, nickel, or other conductive materials. The second conductive layer may be patterned to separate a portion of the second conductive layer from the first conductive layer to create electrodes of a capacitor. In some embodiments, activity 1160 may be used to form conductive layer 222 as described in FIG. 8.

Activity 1170 of method 1100 forms an additional substrate portion on the second conductive layer. The additional substrate portion may include an organic material, for example a polymer material. In some embodiments, activity 1170 may be used to form substrate portion 913 as described in FIG. 9.

Activity 1180 of method 1100 forms a number of conductive paths to allow connections to the first and second conductive layers. The conductive paths may include conductive segments that are formed in one or more of the activities 1110 through 1170.

In the structure formed by method 1100, a portion of the first conductive layer, a portion of the dielectric layer, and a portion of the second conductive layer formed by activity 1110 through activity 1180 are parts of the integrated TFC that is embedded in the substrate of the package. As described in method 1100, each of the components of the integrated TFC is formed individually and directly on the substrate in an in-situ process and without using a lamination process.

The individual activities of method 1100 do not have to be performed in the order shown or in any particular order. Some activities may be repeated, and others may occur only once. Various embodiments may have more or fewer activities than those shown in FIG. 11.

Figure 12:
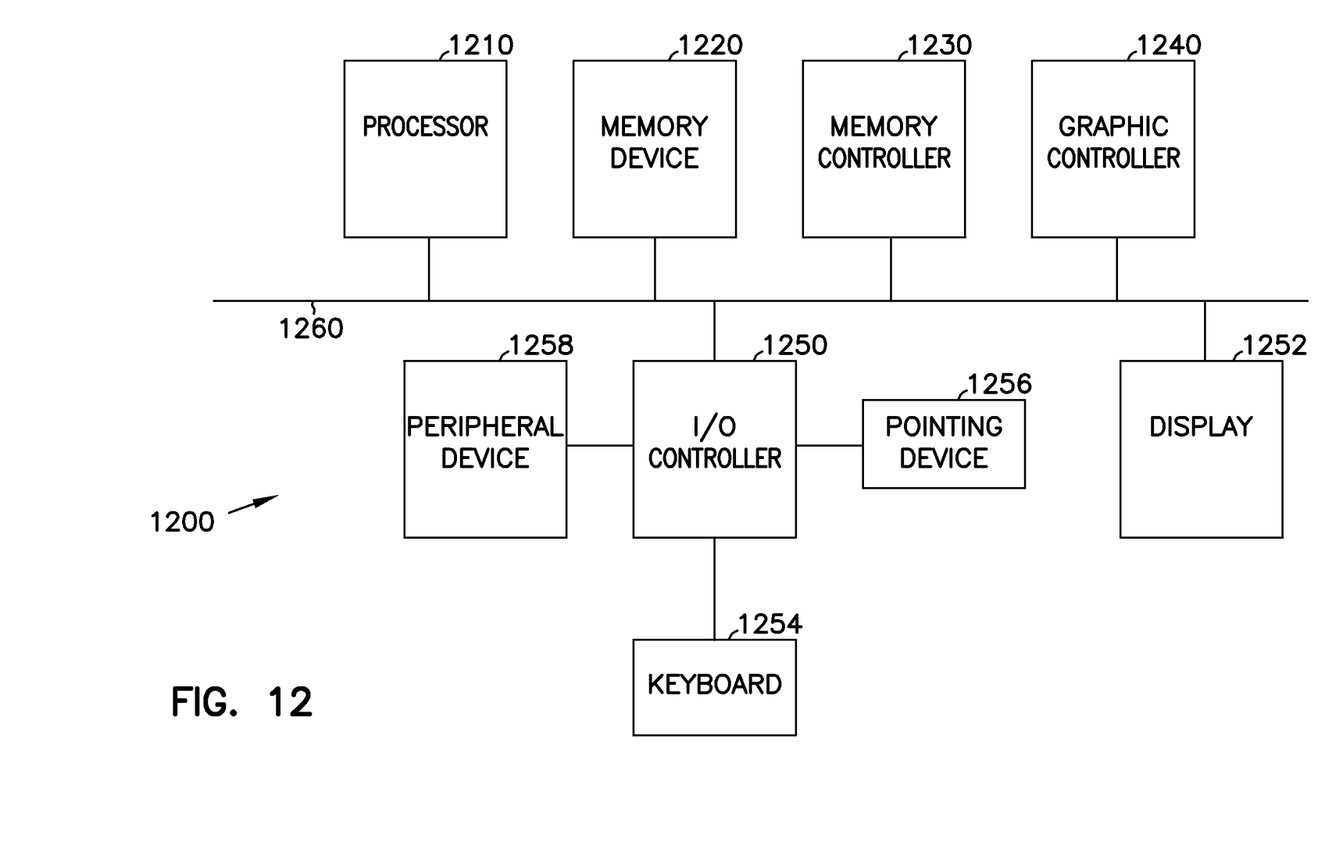
FIG. 12 shows a system according to an embodiment of the invention.

FIG. 12 shows a system according an embodiment of the invention. System 1200 includes a processor 1210, a memory device 1220, a memory controller 1230, a graphic controller 1240, an input and output (I/O) controller 1250, a display 1252, a keyboard 1254, a pointing device 1256, a peripheral device 1258, and a bus 1260.

Processor 1210 may be a general purpose processor or an application specific integrated circuit (ASIC). Memory device 1220 may be a dynamic random access memory (DRAM) device, a static random access memory (SRAM) device, a flash memory device, or a combination of these memory devices. I/O controller 1250 may include a communication module for wired or wireless communication.

One or more or the components shown in system 1200 may be included in one or more integrated circuit packages. For example, processor 1210, or memory device 1220, or at least a portion of I/O controller 1250, or a combination of these components may be included in an integrated circuit package such as package 100 of FIG. 1. Thus, one or more or the components shown in system 1200 may be included in a package, in which the package includes at least one integrated thin film capacitor embedded in a package substrate such as TFC 111 embedded in substrate 104 of FIG. 1 or TFC 811 embedded in substrate 904 of FIG. 9.

FIG. 12 shows system 1200 with a display such as display 1252. In some embodiments, system 1200 may not include a display.

System 1200 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some specific embodiments of the invention sufficiently to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments is determined by the appended claims, along with the full range of equivalents to which such claims are entitled.

What is claimed is:

1. An apparatus comprising:
   a substrate;
   a first electrode layer overlying the substrate, the first electrode layer including a first portion and a second portion;
   a dielectric layer conformal over the first electrode layer, the dielectric layer including a dielectric portion between the first and second portions of the first electrode layer, the dielectric portion having an upper surface below an upper surface of each of the first and second portions of the first electrode layer;
   a second electrode layer overlying the dielectric layer;
   a first conductive path extending through a first opening of the dielectric layer; and
   a second conductive path extending through a second opening of the dielectric layer, one of the first and second conductive paths being coupled to one of the first and second electrode layers, wherein at least a portion of the first conductive path is extended through the substrate, and wherein at least a portion of the second conductive path is extended through the substrate.

2. The apparatus of claim 1, wherein the substrate includes organic substrate.

3. The apparatus of claim 1, wherein the substrate includes a polymer layer.

4. The apparatus of claim 1, further comprising a barrier layer overlying the substrate.

5. The apparatus of claim 4, wherein the barrier layer includes an inorganic material.

6. The apparatus of claim 4, wherein the barrier layer includes an oxide material.

7. The apparatus of claim 1, wherein the dielectric material includes a compound, wherein the compound includes titanium.

8. The apparatus of claim 1, wherein the dielectric layer has a thickness of about one micrometer.

9. An apparatus comprising:
   a substrate;
   a first electrode layer overlying the substrate, the first electrode layer including a first portion and a second portion;
   a dielectric layer conformal over the first electrode layer, the dielectric layer including a dielectric portion between the first and second portions of the first electrode layer, the dielectric portion having an upper surface below an upper surface of each of the first and second portions of the first electrode layer;
   a second electrode layer overlying the dielectric layer;
   a first conductive path extending through a first opening of the dielectric layer, the first conductive path being coupled to the first electrode layer; and
   a second conductive path extending through a second opening of the dielectric layer, the second conductive path being coupled to the second electrode layer, wherein at least a portion of the first conductive path is extended through the substrate, and wherein at least a portion of the second conductive path is extended through the substrate.

10. The apparatus of claim 1, further comprising a die attached to the substrate, wherein the die and the substrate are parts of an integrated circuit package.

11. An apparatus comprising:
    a substrate of an integrated circuit package;

a capacitor overlying the substrate, the capacitor including:
- a first electrode layer;
- a second electrode layer; and
- a dielectric layer between the first and second electrode layers, the dielectric layer including a dielectric portion between first and second portions of the first electrode layer, the dielectric portion having an upper surface below an upper surface of each of the first and second portions of the first electrode layer, wherein a part of an additional second portion of the second electrode layer is below the upper surface of each of the first and second portions of the first electrode layer and contacts the upper surface of the dielectric portion; and
- a first conductive path extending through a first opening of the dielectric layer; and
- a second conductive path extending through a second opening of the dielectric layer, one of the first and second conductive paths being coupled to one of the first and second electrode layers, wherein at least a portion of the first conductive path is extended through the substrate, and wherein at least a portion of the second conductive path is extended through the substrate.

12. The apparatus of claim 11, wherein the substrate includes an organic material.

13. The apparatus of claim 11, further comprising barrier between the substrate and the first electrode layer.

14. The apparatus of claim 11, wherein the dielectric layer includes a ceramic material.

15. The apparatus of claim 13, wherein the barrier layer includes an oxide material.

16. A system comprising:
an integrated circuit package including a substrate, a first electrode layer overlying the substrate, a dielectric layer overlying the first electrode layer, and a second electrode layer overlying the dielectric layer, the dielectric layer conformal over the first electrode layer, the dielectric layer including a dielectric portion between first and second portions of the first electrode layer, the dielectric portion having an upper surface below an upper surface of each of the first and second portions of the first electrode layer, a first conductive path extending through a first opening of the dielectric layer, and a second conductive path extending through a second opening of the dielectric layer, one of the first and second conductive paths being coupled to one of the first and second electrode layers, wherein at least a portion of the first conductive path is extended through the substrate, and wherein at least a portion of the second conductive path is extended through the substrate;
an integrated circuit coupled to the substrate; and
a display coupled to the integrated circuit.

17. The system of claim 16, wherein the first electrode layer, the dielectric layer, and the second electrode layer are parts of a capacitor.

18. The system of claim 16, wherein the dielectric layer includes a ceramic material.

19. A system comprising:
an integrated circuit package including a substrate, a first electrode layer overlying the substrate, a dielectric layer overlying the first electrode layer, and a second electrode layer overlying the dielectric layer, the dielectric layer conformal over the first electrode layer, the dielectric layer including a dielectric portion between first and second portions of the first electrode layer, the dielectric portion having an upper surface below an upper surface of each of the first and second portions of the first electrode layer a first conductive path extending through a first opening of the dielectric layer, the first conductive path being coupled to the first electrode layer, and a second conductive path extending through a second opening of the dielectric layer, the second conductive path being coupled to the second electrode layer, wherein at least a portion of the first conductive path is extended through the substrate, and wherein at least a portion of the second conductive path is extended through the substrate;
an integrated circuit coupled to the substrate; and
a display coupled to the integrated circuit.

* * * * *